United States Patent
Lee et al.

(10) Patent No.: US 7,288,776 B2
(45) Date of Patent: Oct. 30, 2007

(54) OPTICAL HEAD CAPABLE OF PROVIDING A SUBWAVELENGTH BEAMS

(75) Inventors: Chih Kung Lee, Taipei (TW); Liang Bin Yu, Taipei County (TW); Jiunn Woei Liaw, Taipei (TW); Ding Zheng Lin, Taipei (TW); Jyi Tyan Yeh, Hsinchu County (TW); Yu Tsung Chiu, Taipei (TW); Chun Ti Chen, Tainan County (TW); Chyan Chi Wu, Hsinchi County (TW); Chau Shioung Yeh, Taipei (TW); You Chia Chang, Taichung (TW); Kuo Tung Huang, Taoyan County (TW); Yi Chun Chen, Hualien County (TW); Yeong Feng Wang, Taipei County (TW)

(73) Assignee: Industrial Technology Research Institute, Hsinchu (TW)

( * ) Notice: Subject to any disclaimer, the term of this patent is extended or adjusted under 35 U.S.C. 154(b) by 560 days.

(21) Appl. No.: 10/874,236

(22) Filed: Jun. 24, 2004

(65) Prior Publication Data
US 2006/0153045 A1    Jul. 13, 2006

(30) Foreign Application Priority Data
Jun. 26, 2003   (TW)   ................................. 92117422 A

(51) Int. Cl.
*G21G 4/00*   (2006.01)
(52) U.S. Cl. .................................. 250/493.1; 250/492.1

(58) Field of Classification Search ..................... None
See application file for complete search history.

(56) References Cited

U.S. PATENT DOCUMENTS

| 6,236,033 | B1* | 5/2001 | Ebbesen et al. | ............ 250/216 |
| 6,834,027 | B1* | 12/2004 | Sakaguchi et al. | ....... 369/13.32 |
| 7,057,151 | B2* | 6/2006 | Lezec et al. | ................ 250/216 |
| 7,154,820 | B2* | 12/2006 | Nakada et al. | .......... 369/13.32 |
| 7,176,450 | B2* | 2/2007 | Hollingsworth | ............. 250/234 |

* cited by examiner

*Primary Examiner*—Paul W. Huber
(74) *Attorney, Agent, or Firm*—Bacon & Thomas, PLLC

(57) ABSTRACT

The present invention provides an optical head with a single or multiple sub-wavelength light beams, which can be used in arenas such as photolithography, optical storage, optical microscopy, to name a few. The present invention includes a transparent substrate, a thin film, and a surface structure with sub-wavelength surface profile. The incident light transmits through the transparent substrate, forms a surface plasma wave along the sub-wavelength aperture located within the thin film, and finally re-emits through spatial coupling with the sub-wavelength profile of the surface structure. As the coupled re-emitting light beam or light beams can maintain the waist less than that of the diffraction limit for a few micrometers out of the surface with sub-wavelength profile in many cases, this invention can have applications ranging from micro or nano manufacturing, metrology, and manipulation by using light beams with waist smaller than the diffraction limit.

15 Claims, 16 Drawing Sheets

OPTICAL HEAD CAPABLE OF PROVIDING A SUBWAVELENGTH BEAMS

BACKGROUND OF THE INVENTION

1. Field of the Invention

The present invention relates to a new design of an optical head capable of providing a subwavelength beam.

2. Description of the Related Art

Optical lithographic technology has been broadly used in various researches due to its convenience since 1665. Besides, since the middle of $20^{th}$ century, the related applications are deeply extended to various high technology industries, for example, semiconductor and optical storage industries (e.g. CD, DVD etc.) However, owning to the diffraction limit, various optical applications confront with same difficulties when an optical resolution smaller than one wavelength is required.

Optical Lithography

Under the push of Moore's law of the semiconductor industry, the optical etching linewidth has been shrunk from 5 micrometers in the late 1960 to 90 nanometers nowadays. The optical etching linewidth is still persistently shrunk. Since the visible light optical etching fulfills advantages of high yield and low cost, it is always a primary etch technique in semiconductor processes. Because the dimension of the diffraction limit is equivalent to the wavelength, it is difficult to further shrink the optical etching linewidth when the linewidth reaches up to the order of the wavelength. For the sake of persistently shrinking the etching dimension, the development of short wavelength light sources has become an important field to study. The light source has been varied from 436 nm visible wavelength to 248 nm deep ultraviolet wavelength and till 157 nm nowadays. The light source with the shorter wavelength, even more X-ray range, is still developed.

The shrinkage of the exposing wavelength reduces the size of a focusing optical spot. However, the optical elements suitable for the visible light range are not light transmitted in the short wavelength range. Only fused silica and less material are suitable for the ultraviolet range. The flexibility of selection of the optical materials is significantly reduced. Moreover, the refractive index of the above materials in the short wavelength range is not high. It is quite difficult to design an appropriate lens with high numerical aperture and low aberration. The requirement of the accuracy of a phase mask used during exposing is getting stricter because the exposing wavelength becomes shorter. Besides, owing to the property of wave propagation of laser light in free space, the depth of focus and focusing optical spot have the same dimension. As a result, when the focusing optical spot approximates to a sub-micrometer size, the depth of focus would approximate to surface roughness of a general test sample. Therefore, it is necessary to add a fast automatic focusing system to correct the optical path to avoid the defocusing phenomenon that arises an unexpected optical spot, when performing etching. To summarize the foregoing, the optical mechanism becomes more complicated when performing etching as the wavelength shrinks, and the cost is increased more and more.

On the other hand, although the current non-optical etching method can provide a higher space resolution, it cannot provide the property of high yield of the optical etching method. To give an example by the electron beam lithographic technique, which utilizes electron beams composed of accelerated electrons to impact the material, resulting in chemical or physical reactions to attain the effect of etching patterns. Since the material wavelength of the electron is far smaller than the wavelength of light, its diffraction limit is smaller and the resolution can attain several nanometers. However, the equipment is very expensive and needs to operate in vacuum, and the yield thereof is also limited. Hence, the equipment is not suitable for being as a parent machine for manufacturing products in large quantities. The non-optical etching method is mostly used in the preparation of original masks. In addition, there is a new lithographic technique as called atomic force microscopy lithography developed in recent years. The atomic force microscopy lithography utilizes a probe of the atomic force microscope to generate electric field to cause an inducing selective chemical reaction, for example etching or deposition. The atomic force microscopy lithography provides a high resolution of ten-nanometer order, but its etching area is too small and the etching speed is too slow. To summarize the foregoing, the optical lithography is still un-replaceable for the manufacturing process with high yield.

Optical Storage

As a non-contact property of the optical method, the optical storage provides the following advantages: 1. non-destructive by abrasion; 2. long life time; and 3. non-influence by dust when reading. Moreover, the optical storage device has a high optical storage density. The application of the optical storage is widespread. For example, CD (Compact Disc) and DVD (Digital Video Disc) have become indispensable data storage media in modern life. As the rapid advancement of network, multimedia and software, it is a trend to develop a data storage media with a higher capacity and a smaller volume.

The present commercialized optical storage devices include CD, DVD and MO (Magnetic Optical device). Since DVD-ROM (Digital Video Disc-Read Only memory) provides a higher capacity and a capability for reading CD-ROM, it has replaced CD-ROM in recent years. Although MO is directed to a storage system with a high capacity and high speed, it cannot become a main stream in the marketing due to its highly cost.

The optical storage device usually writes data in a compact disc, and its recording method is through indentations with different lengths between the tracks of the compact disc. The intensity of the light reflected from the indentations is weaker and the intensity of the light reflected from the tracks is stronger. Thus, by way of detecting the intensity of the light reflected from the compact disc to read data recorded therein. The compact discs of CD-ROM (Compact Disc-Read Only Memory) and DVD-ROM (Digital Video Disc-Read Only Memory) are produced in large quantities by copying the data recorded in the mold by pre-pressing. Nevertheless, CD-R and DVD-R utilize a laser source with a short wavelength to break the long chain of dye molecules to change the refractive indexes so as to form low-reflective indentations to write data. Phase change material is applied to CD-RW, DVD-RW and DVD-RAM, and which uses a high-power laser with short pulses to write data, by which the phase change material is rapidly cooled to form an amorphous state, which has a lower reflective index than that of the crystalline state formed by annealing with a long-pulse laser, thus to form indentations. The tracks of the compact disc are formed of a saw-teethed structure having peak and valley portions so as to conveniently write into data along the tracks. Except for the DVD-RAM capable of recording data in both of the peak and valley portions for improving data density, remaining optical storage devices record data in the valley portions.

For the optical pickup head, a laser spot is focused unto a surface of the compact disc through an objective, and reflected from the surface of the compact disc to image on a light detector through the objective. The resolution of the optical pickup head is confined by the size of the optical spot. When focusing the light source, the size of the optical spot is mainly relied upon a result gotten by dividing the wavelength λ of the light source by the numerical aperture of the objective. The size of the optical spot on the surface of the compact disc is determined by the multiplication of the thickness d of a substrate of the compact disc and the numerical aperture. Making a comparison, the pitch of the tracks of DVD is 0.74 µm, the shortest length of the indentations of DVD is 0.43 µm, a laser light with λ 650 nm and NA (Numerical Aperture) 0.6 can be used to access the compact disc of DVD; the pitch of the tracks of CD-ROM is 1.6 µm, the shortest length of the indentations of CD-ROM is 0.83 µm, a laser light with λ 780 nm and NA (Numerical Aperture) 0.45 can be used to access the compact disc of CD-ROM.

In order to obtain high storage density, it had better have a unit storage area as small as possible. However, due to the diffraction limit, the size of the focusing optical spot of the optical pickup head at the best can approximate to the wavelength of the light source. As a consequence, the unit storage area cannot be further shrunk. It is currently a trend to shrink the wavelength of the light source. There are many difficulties exiting in the technology using a light source with a short wavelength. Meanwhile, the depth of focus become shallower and requirement of stability of the compact disc is improved, resulting in a significant increase of the cost.

Optical Imaging and Probing

The resolution of the far-field optical measuring system is confined by the principle of the diffraction. Waves with too high space frequency become evanescent waves, and cannot propagate to far field. Thus, the optical spot cannot be focused to a spot less than the wavelength order, and the resolution only can reach up to about the wavelength. Near-field optical microscope is a kind of surface monitoring instrument that can break through the diffraction limit of the conventional optical microscope. The near-field optical microscope generally associates with a voltage actuator or an air bearing to form a system to perform the height-feedback control. Therefore, the optical probe can be accurately controlled over the surface of the sample to be monitored at a height about several to hundreds nanometers. When performing three-dimensional feedback-controllable near-field scanning, surface topography and optical image can be obtained, and the resolution can reach up to about 30 nm to 100 nm. The optical fiber probe is often used as the probe, and the diameter of its tip is between 50 nm and 100 nm.

Synge in the United Kingdom in 1928 and O'keefe in the United States in 1956, respectively propose the basic principle of the near-field optical microscope, which utilizes a distance far less than a wavelength to perform optical measurement to break through the diffraction limit. E. A. Ash and G. Nicholls of the UCL university of the United kingdom firstly completes the experimental verification of the near-field optical microscope, which utilizes microwave with a 3 cm wavelength to pass the microscope formed of a probe with a 1.5 mm aperture, and a 0.5 mm resolution is readily obtained. And, a space resolution about 1/60 wavelength can be obtained in the near field. Bell laboratory utilizes optical fiber as a probe by a shear-feedback control method in 1992 to complete a first near-field optical microscope. By way of shrinking the aperture of the probe and the distance between the probe and surface of the object to be monitored to obtain a smaller focusing optical spot and information of evanescent waves unavailable by the far-field optical microscope, thus breaking through the diffraction limit. The near-field optical microscope provides a quite high space resolution in measuring a testing object, providing another definite and practicable method for measuring a micro object.

However, there are many limitations existing for the near-field optical microscope: for detecting evanescent waves, an approximating zero working distance between the probe and the surface of the testing object is required, and to obtain the approximating zero working distance, a precise feedback control technology and an expensive air-bearing machine are required. On the other hand, since the light transmittance is too small, it is not easy to obtain a good signal to noise ratio. If the intensity of the incident light is to be increased, the tip of the probe is easily destroyed since the temperature is over high.

Extraordinary Transmittance Phenomenon Caused by a Surface Subwavelength Structure Dr. Ebbesen proposed an extraordinary transmittance phenomenon caused by a surface subwavelength structure in Nature in 1998, which cannot be explained by the conventional diffraction phenomenon. The light transmittance measured by experiments is far higher than the result calculated by the micro-hole diffraction theory proposed by Bethe in 1944, and arising many discussions and studies. FIG. 1 shows important parts of a series of studies made by the team of Dr. Ebbesen, in which it is discovered that the light transmittance through the subwavelength hole arrays perforated a metal layer and a underlying substrate is far higher than that calculated by the conventional diffraction theory. A subsequent study indicates that the extraordinary transmittance phenomenon still happens if there is a periodic structure formed on the surface of the metal layer as an auxiliary, and it is not necessary for the hole-arrayed structure to perforate the metal layer and substrate. Besides, it is discovered that a structure of concentric circles with a central perforated hole can improve the light transmittance. Dr. ebbesen et al. publish another important article in August, 2002 that a subwavelength structure is formed on each face of a metal thin layer, and improving the light transmittance and the divergence angle of the transmitting light is far smaller than that predicated by the diffraction theory. For example, in case that groove period=500 nm, groove depth=60 nm, hole diameter=250 nm, film thickness=300 nm, it is discovered that the energy of the light beam ($\lambda_{peak}$=660 nm) transmitting the hole-arrayed structure is confined within 3 degree. It shows that the hole-arrayed structure makes the transmitting light beam have directionality, which is totally contrary to the perception of the conventional optics that when the light beam is incident in a hole smaller than the wavelength of the light beam, the transmitting light beam would provide isotropous divergence, i.e. viewing the hole approximating to a point light and the outward propagating waves as spherical waves.

SUMMARY OF THE INVENTION

The present invention implements the surface subwavelength element to modulate the transmitted optical field so as to provide a subwavelength-scale optical spot, which breaks through the conventional diffraction limit. The material of the surface subwavelength element depends upon the wavelength of the incident light, and is not limited to metal materials. This implementation can be introduced in the optical head of the present various optic architectures to improve various technologies such as optical lithography, optical storage as well as optical imaging and probing.

BRIEF DESCRIPTION OF THE DRAWINGS

The objectives and features of the present invention as well as advantages thereof will become apparent from the following detailed description, considered in conjunction with the accompanying drawings.

DETAILED DESCRIPTION OF THE INVENTION

Explanation of Principle

Diffraction Limit of Far Field Optics

The size of a conventional focusing optical spot is confined by the diffraction limit. In a given wavelength, no matter how to improve performance of an optical system, the focusing optical spot cannot be shrunk to be smaller than a limit, which is proposed by Ernst Abbe in 1884. This limit is based on the principle of diffraction, and called "diffraction limit".

The principle of diffraction is briefly described as follows: spatial optical waves can be decomposed to a combination of plane waves in various directions by the fourier optics method. In a specific wavelength, the space frequencies of the plane waves are the same and the difference among them is merely the directions thereof, which can be represented by the equation (1):

$$k_x^2 + k_y^2 + k_z^2 = k^2 = \left(\frac{2\pi}{\lambda}\right)^2 \tag{1}$$

Wherein, $k_x$, $k_y$ and $k_z$ respectively are components of space frequency in X, Y and Z axis.

Considering a distribution of electric field existing at a plane in the direction of Z=0, if the space frequencies $k_x$, and $k_y$ are too high, let $$k_z^2 = k^2 - k_x^2 + k_y^2 < 0$$

It is inferred that $k_z$ must be an imaginary number, and electromagnetic waves propagate evanescently in Z direction. That is to say, the intensity of the electromagnetic waves is exponentially decayed in Z direction. As a result, the component with the space frequency higher than k cannot propagate toward far field. Hence, one pattern with a space frequency higher than k cannot be produced by way of the far field technology such as lens focusing. In view of space domain, the focusing limit is equivalent to the wavelength, which is the meaning of diffraction limit.

Modulation of Optical Field by a Metal Subwavelength Element

Figure 1:
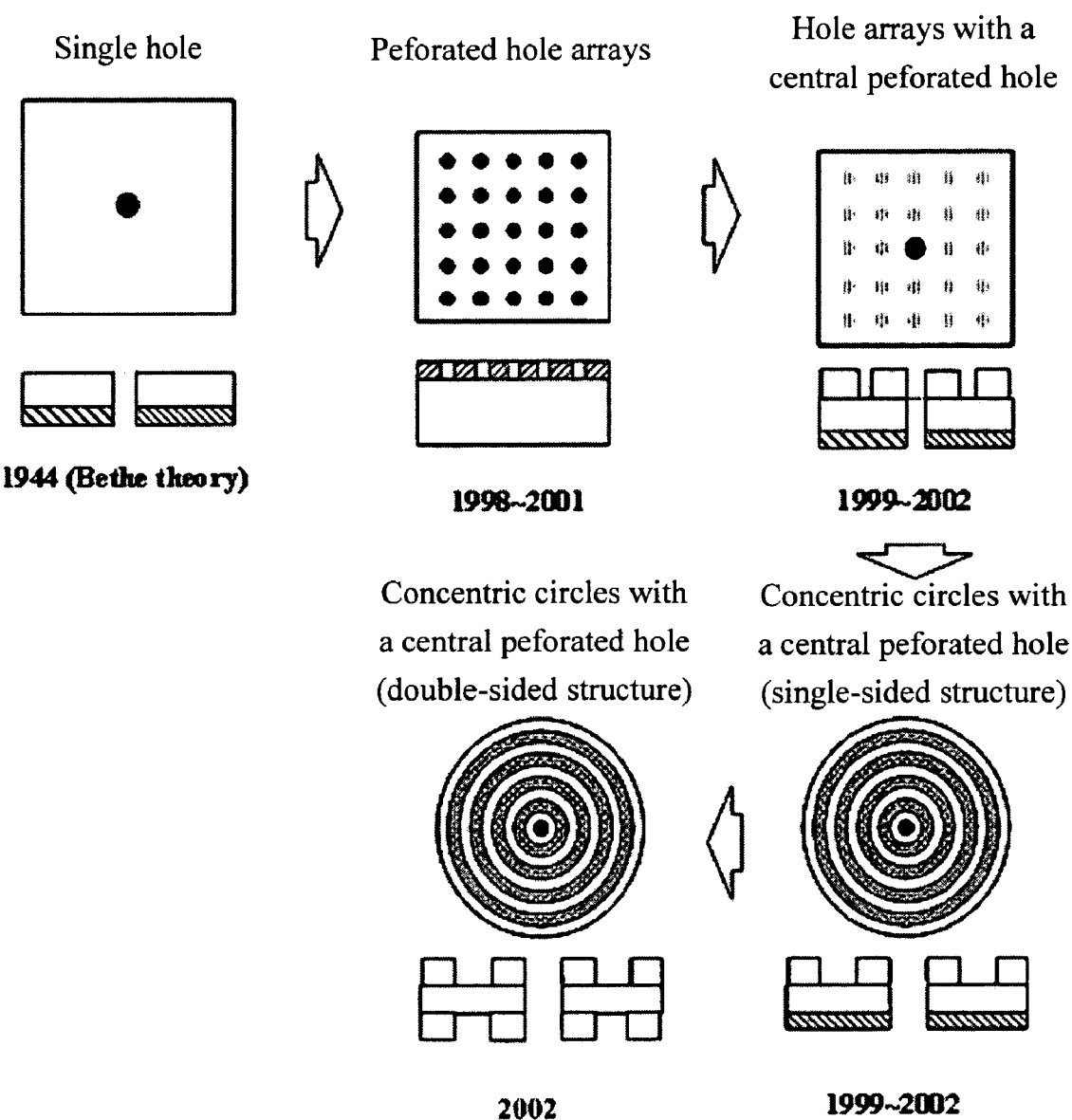
FIG. 1 is a diagram showing a progressive development of the related arts in newly studies.
Figure 2:
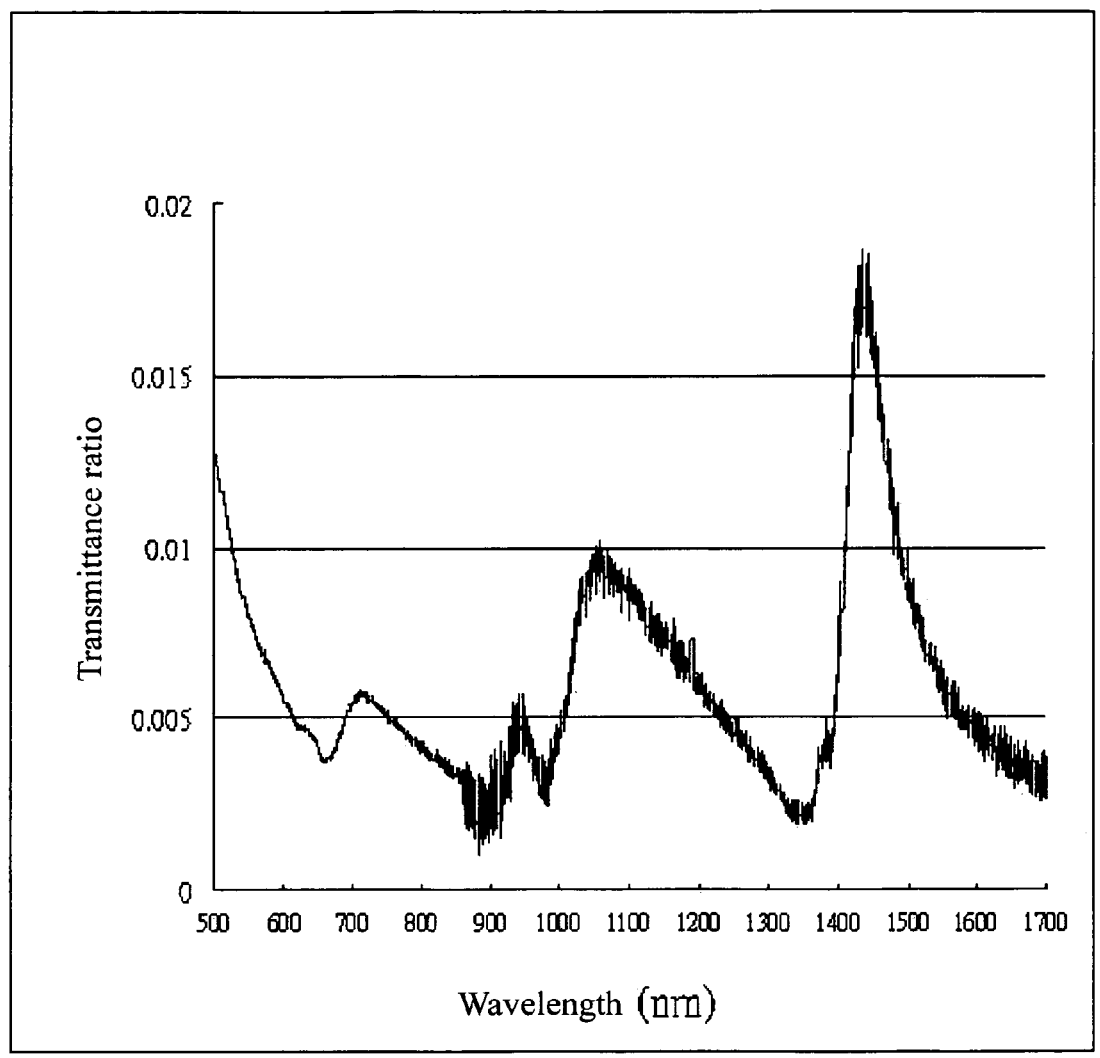
FIG. 2 is an extraordinary transmittance spectrum caused by a surface structure.

Dr. Ebbesen publishes a series of literatures beginning in 1998, providing that producing a surface structure nearby one single hole whose size smaller than a subwavelength to modulate the transmitted optical field, the light transmittance of the hole would increase two to three orders in comparison with that without the surface structure formed nearby, as shown in FIG. 2. This phenomenon is related to the ratio of the optical wavelength to the period of the grating structure and the height to width ratio. Meanwhile, the scattering angle of the modulated optical field behind the hole is very smaller, its full width at half maximum (FWHM) is merely within about 3 degrees, totally contrary to the known diffraction phenomenon.

With regard to the extraordinary transmittance phenomenon, there is no consensus for its physical mechanism. Basically, there are two explanations for this extraordinary transmittance phenomenon. One utilizes the result of the coupling resonance of the surface plasma waves and light to delivery energy to the other side of the grating; the other utilizes the concept of a waveguide, to explain the optical waves delivery energy in the hole and emit light at one another side. The former explanation is currently accepted by most of people working in this field.

Surface plasma wave is an electromagnetic wave occurred at the interface between the metal and dielectric, and the electric field thereof in the metal and dielectric region is exponentially decayed. The surface charge density harmonically oscillates and propagates in the interface between the metal and dielectric in a form of surface charge cloud. In view of wave propagation vector, the wave propagation vectors of the surface plasma wave and interior of the bulk material can be respectively represented as follows:

$$K_{sp} = K_o \sqrt{\frac{(\varepsilon_m \varepsilon_b)}{(\varepsilon_m + \varepsilon_b)}} \quad (3)$$

$$K_b = K_o \sqrt{\varepsilon_b} \quad (4)$$

Wherein, $K_0$ represents the wave propagation vector in vacuum, $K_{sp}$ and $K_b$ respectively represent the propagation vectors of the surface plasma wave and the interior of the bulk material. When $K_{sp}=K_b$, namely the wave propagation vectors are matched, the light incident in the interior of the bulk material can stimulate surface plasma waves, and thereby introducing energy into the interface.

Figure 3:
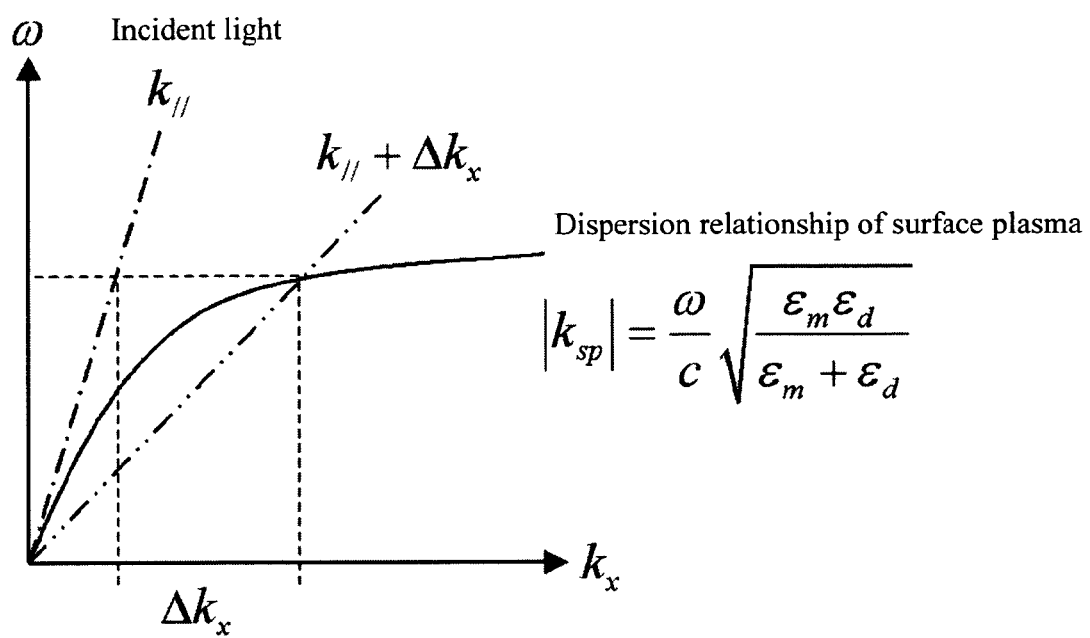
FIG. 3 is a diagram showing a curve of dispersion relationship of surface plasma.

FIG. 3 is a diagram showing a curve of dispersion relationship of the surface plasma, the linear line $K_{//}$ represents the light propagating in air without crossing with the curve of the dispersion relationship of the surface plasma. It shows that the light in air incident in the metal does not excite the surface plasma wave. There are two ways to excite the surface plasma. One is to provide incident light in the form of evanescent waves to decrease the slope of the linear line to cross the curve of the dispersion relationship of the surface plasma wave; and the other is to provide a periodic structure in the surface of the interface to provide additional momentum in X direction, giving one opportunity for crossing the linear line and the curve. When the linear line and the curve are crossed, the resonance condition of the surface plasma is satisfied, and the photons would deliver energy to the surface plasmon by resonance. Using gratings to provide additional momentum on the surface to make crossing of the optical waves and the curve of the dispersion relationship of the surface plasma wave, the optical waves would couple with the surface plasma waves in accordance with the conservations of energy and momentum. If the thickness of the structure is appropriate, upper surface plasma waves would couple with lower surface plasma waves to delivery energy to one another side, and then the surface plasma waves couple with optical waves again to convert energy to optical waves to propagate outwardly.

It can be inferred in view of the foregoing discussion that the wavelength of the incident light satisfies the resonance condition, namely the following equation (5) is sustained, and surface plasma wave is excited efficiently.

$$\lambda_{Max}(i,j) = a_0 (i^2+j^2)^{-1/2} (\varepsilon_m \varepsilon_b/(\varepsilon_m+\varepsilon_b))^{1/2} \quad (5)$$

Wherein $a_0$ is structure period, $\epsilon_m$ and $\epsilon_b$ respectively are the dielectric constants of the metal and the incident interface. Besides, due to the surface plasma wave existing on the surface structure, if appropriately selecting the structure dimension, the surface field and radiated electromagnetic field would go through destructive interference, to further eliminate the electromagnetic fields that should be divergent at two sides. As a result, the divergence of the modulated optical wave behind the hole is decreased.

Diffraction Theroy of Electromagnectic Waves of Levine and Schwinger

The behavior of the effective cross section of the sub-wavelength surface structure on the metallic thin film larger than 1 can be explained by the electromagnetic diffraction of one single nanometer aperture proposed by Levine and Schwinger in the Journal of Electromagnetic Wave in 1950. The theory thereof is explored following.

For a metallic thin film being infinitely large and thin as well as being a perfect conductor, when the electromagnetic waves are incident from Z direction in the metallic thin film, and passing through the hole of the metallic thin film, the diffraction behavior would be occurred in Z direction. To calculate the diffraction intensity of the hole, the boundary conditions of the metallic thin film should be firstly derived. Considering the symmetry of the incident plane of the electromagnetic waves and the diffraction plane, the boundary conditions are obtained:

$z \leq 0$ $E(r) = E_0(r) + E_1(r); \quad H(r) = H_0(r) + H_1(r)$ $z \geq 0$ $E(r) = E_2(r); \quad H(r) = H_2(r) \quad (6)$ Following, the problems of the electric and magnetic fields under the boundary conditions are treated by Green's Function. When one area is provided with electric current and electric charges, following relation (7) can be obtained by Maxwell equations:

$$\nabla \times (\nabla \times E) - k^2 E = \frac{4\pi ik}{c} J - \frac{4\pi}{c} \nabla \times J^* \quad (7)$$

$$\nabla \times (\nabla \times H) - k^2 H = \frac{4\pi ik}{c} J^* + \frac{4\pi}{c} \nabla \times J$$

Wherein J is current density and J* is symmetric magnetizing current. The full-field Green's function and its solution derived from the relation (7) are as equation (6.3). The relation (7) obeys the boundary condition G=0 as r is infinitely far:

$$\nabla \times (\nabla \times \Gamma^0) - k^2 \Gamma^0 = \varepsilon \delta(r - r') \quad (8)$$

$$\Gamma^0(r, r') = \left(\varepsilon - \frac{1}{k^2} \nabla \nabla'\right) \frac{\exp(ik|r - r'|)}{4\pi|r - r'|}$$

Figure 4:
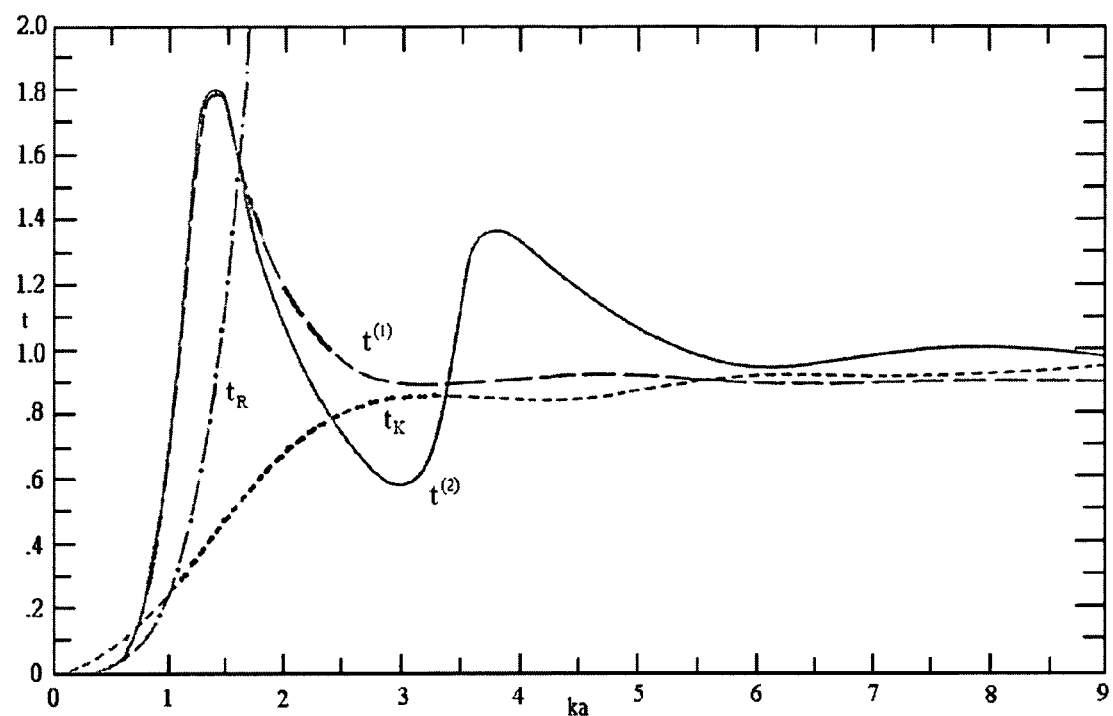
FIG. 4 is a diagram showing scattering effective cross sections of incident light vs. holes of different sizes.

Further establishing a half-field Green's Function by a method of image, and introducing Green's second vector identity and symmetry of Green's function to obtain electric and magnetic fields arisen by the surface current of the metallic thin film. Since the current density is a difference value of the magnetic field in the tangential direction, both of the derived electric and magnetic fields are integration forms including magnetic field and full-field Green's Function. Finally taking an approximate value to simplify the form of the electromagnetic field, and obtaining a far field distribution of the electromagnetic field. This result is introduced in Poynting vector for understanding of energy flow. Furthermore, the form of the energy flow is treated by Bessel Function to obtain total energy passing through the hole. If the effective cross section is defined by the total energy passing through the hole divided by the area of the hole. Taking its first-order and second-order approximate formulas to respectively compare with Rayleigh-Bethe and Kirchhoff diffraction formulas:

$$t^{(1)} = \frac{8}{9\pi} ka \cdot \mathrm{Im} \frac{1}{F_{11}(ka) + kaF'_{11}(ka)} \quad (9)$$

$$= \frac{64}{27\pi^2}(ka)^4 \left[1 + \frac{27}{25}(ka)^2 + 0.72955(ka)^4 + \ldots\right]$$

$$t^{(2)} = \frac{8}{9\pi} ka \cdot \mathrm{Im} \begin{bmatrix} F_{22}(ka) - kaF'_{22}(ka) - (1/25)(ka)^2 \\ \frac{\{F_{11}(ka) + kaF'_{11}(ka) - 10F'_{12}(ka)\}}{\{F_{11}(ka) + kaF'_{11}(ka)\}} \\ \{F_{22}(ka) - kaF'_{22}(ka)\} + \{kaF'_{12}(ka)\}^2 \end{bmatrix}$$

$$= \frac{64}{27\pi^2}(ka)^4 \left[1 + \frac{27}{25}(ka)^2 + 0.74155(ka)^4 + \ldots\right]$$

$$t_R = \frac{64}{27\pi^2}(ka)^4 \left[1 + \frac{27}{25}(ka)^2 + 0.72955(ka)^4\right]$$

$$t_K = 1 - \frac{1}{2ka}\int_0^{2ka} J_0(t)dt = \frac{(ka)^2}{3}, ka \to 0; \approx 1, ka \to \infty.$$

Wherein a=radius of the hole, $$k = \frac{2\pi}{\lambda} \cdot t^{(1)}$$

is a first-order diffraction approximation, $t^{(2)}$ is a second-order diffraction approximation, F is an integration form including Bessel Function to represent electric field of Poynting vector and Green's function; $t_R$ is Rayleigh-Bethe diffraction formula; $t_K$ is Kirchhoff diffraction formula. Four curves respectively plotted by the above four formulas are shown in FIG. 4. From the drawing of FIG. 4, the three diffraction formulas behave differently in respective sections. Rayleigh-Bethe diffraction formula merely has the former terms when expanded by ka. As ka is increased, the effective cross section is infinitely increased, which is contrary to the known physical phenomenon. Therefore, Rayleigh-Bethe diffraction formula is only suitable for diffraction behavior of the incident electromagnetic waves with a very long wavelength. For a short wavelength, Rayleigh-Bethe diffraction formula cannot reasonably predict the effective cross section of the electromagnetic waves. By the way, Kirchhoff diffraction formula postulates the electromagnetic field of the diffraction plane is merely influenced by the surface current of the metallic thin film when calculating, and neglecting the effect of the hole to the electromagnetic field. Kirchhoff diffraction formula can obtain a reasonable effective cross section in a long wavelength range. Its value is 1. But when ka is less than 3, the effective cross section calculated by Kirchhoff diffraction formula is far less than the values calculated by the other diffraction formulas.

The diffraction formula of Levine and Schwinger represents the far field diffraction behavior of the light incident in the hole of the metal sheet. As ka is small, it shows diffraction behavior of the electromagnetic wave similar to that of Rayleigh-Bethe diffraction formula. As ka is increased, namely the incident wavelength decreased, the effective cross section with the behavior of Bessel function approximates 1. It also fulfills the behavior of the effective cross section in a short wavelength derived by Kirchhoff diffraction formula. Since the diffraction theory of Levine and Schwinger has not special postulations, it provides highly suitability.

As to the foregoing double surface structures of the metallic thin film, the structure of the incident surface is primarily to increase light transmittance, and the structure of the emitting surface is primarily to depress the divergence angle of the transmitted optical field, the effect of the structure of the incident surface could be replaced by the appropriate single hole derived by the diffraction formula of Levine and Schwinger, even the incident surface of the metallic thin film is not provided with the surface structure. The high transmittance with the effective cross section higher than 1 still can be obtained by properly designing the size of the hole. The thickness of the metallic thin film employed in previous experiments for studies is merely 300 nanometers, and the metallic thin film is not provided with any support. Its structure is too fragile. When using the metallic thin film as the optical head, it is easily destroyed even slightly applying force upon it. From a view of engineering application, it is highly difficult to manufacture double surface microstructures, and which are hardly produced in a large quantity. Therefore, the Levine-Schwinger diffraction theory of electromagnetic waves can provide a practicability for designing an optical head with a single surface structure, and having a potential for applying the non-conventional optical phenomenon of the double surface structures to the practical engineering application.

Design of Optical Head

Figure 5:
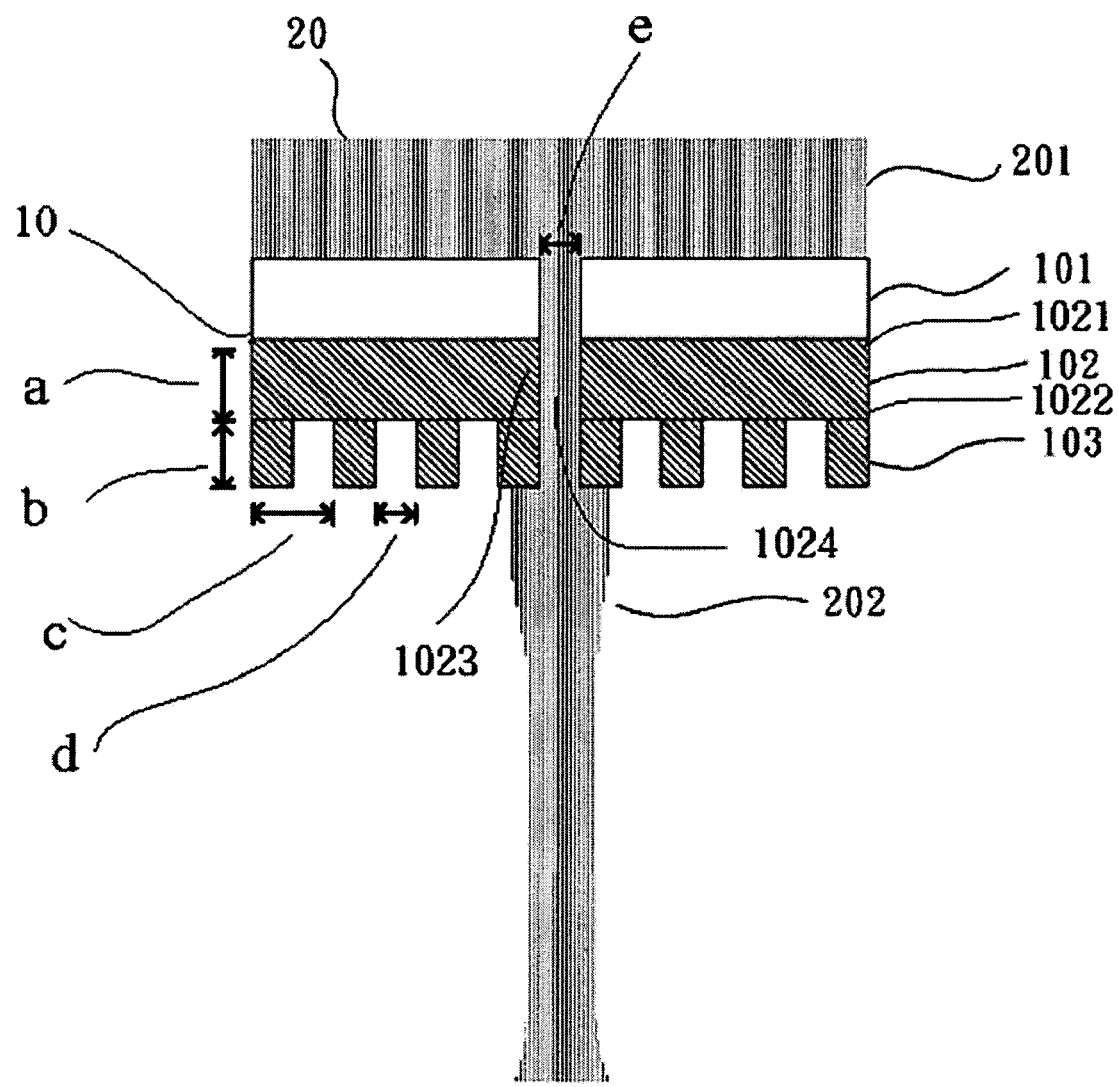
FIG. 5 is a schematic cross sectional view of an optical head of the present invention.
Figure 6A:
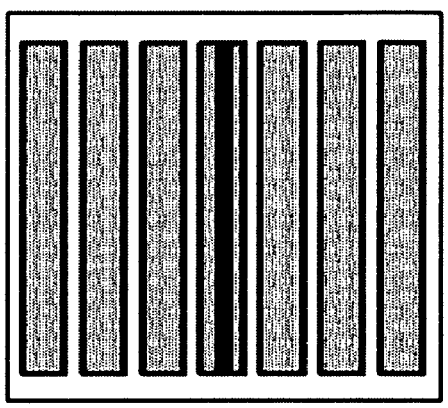
FIG. 6A is a bottom view of one alternation of a surface subwavelength structure of the present invention.
Figure 6B:
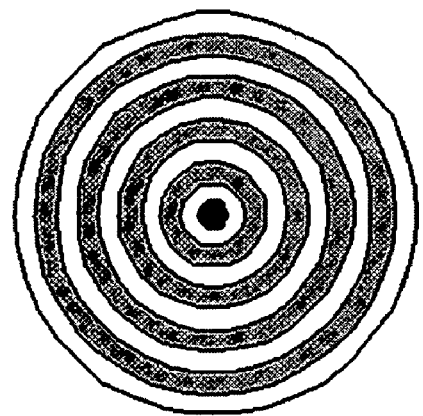
FIG. 6B is a bottom view of another alternation of the surface subwavelength structure of the present invention.

The present invention provides an optical head whose structure is as shown in FIG. 5. The optical head 10 includes a transparent substrate 101, a thin film 102 having a first surface 1021 and a second surface 1022, an inner surrounding wall 1023 extending from the first surface 1021 to the second surface 1022, a passage 1024 with a subwavelength aperture confined by the inner surrounding wall 1023 and a surface subwavelength structure 103. The surface subwavelength structure 103 can be a periodic structure or a grating structure. Besides, a is the thickness of the thin film 102, b is the depth of structure, c is the period of structure, d is the width of structure, and e is the dimension of the aperture of the passage 1024. In general, d should be larger than or equal to e. In addition, an external electromagnetic field 20 including an incident light 201 and an emitting light 202 is applied on the optical head 10. The incident light 201 transmits the transparent substrate 101 but hardly directly transmit the thin film 102, and only transmitting through the passage 1024 in a form of surface waves to form a new light source at an exit of the optical head 10, and re-emitting energy by diffraction. The transparent substrate 101 is also used for supporting the thin film 102. The surface subwavelength structure 103 is used for modulating the transmitted optical field (i.e. the surface waves transmitted through the passage 1024), and its structure can be formed of either of a plurality of elongated strips with a centered slit and a plurality of concentric circles with a centered hole, which are respectively as shown in FIG. 6A and FIG. 6B. The surface subwavelength structure 103 is used for controlling the optical field emitting from the optical head 10 in order that most energy is able to be concentrated in a subwavelength-scale area. A good subwavelength light source can be defined by the subwavelength-scale area whose full width at half maximum less than $0.75\lambda$ of the incident light 201 and its peak energy larger than other areas at least one order.

The design parameters of the optical head 10 can be appropriately converted for being suitable for various light sources with different wavelengths. The conversion method can be derived by the following ways. Considering nonmagnetic material, i.e. $\mu=\mu_0$, if under the circumstance with original design parameters, initial conditions and boundary conditions, it is assumed that the distributions of the electric and magnetic fields are $\vec{E}(\vec{r})$ and $\vec{H}(\vec{r})$, and free electric charges and free current density are neglected, the electric and magnetic fields should fulfill following Maxwell's equations with a single frequency.

$$\nabla \cdot \left[\varepsilon_{M_1}(\omega, \vec{r})\vec{E}(\vec{r})\right] = 0 \quad (10)$$

$$\nabla \cdot \left[\mu_0 \vec{H}(\vec{r})\right] = 0$$

$$\nabla \times \vec{E}(\vec{r}) = -j\omega\mu_0 \vec{H}(\vec{r})$$

$$\nabla \times \vec{H}(\vec{r}) = j\omega\varepsilon_{M_1}(\omega, \vec{r})\vec{E}(\vec{r})$$

After coordinate transformation to reduce a space dimension a times, namely $$\vec{r}' = \vec{r}/a$$

The functions of the original electric and magnetic fields also can fulfill Maxwell's equations by the following ways.

$$a\nabla' \cdot \left[\varepsilon_{M_1}(\omega, \vec{r}')\vec{E}(\vec{r}')\right] = 0 \quad (11)$$

$$a\nabla' \cdot \left[\mu_0 \vec{H}(\vec{r}')\right] = 0$$

$$a\nabla' \times \vec{E}(\vec{r}') = -j\omega\mu_0 \vec{H}(\vec{r}')$$

$$a\nabla' \times \vec{H}(\vec{r}') = j\omega\varepsilon_{M_1}(\omega, \vec{r}')\vec{E}(\vec{r}')$$

If choosing $$\omega' = \omega/a, \quad (12)$$

$$\lambda' = 2\pi c/\omega' = a\lambda,$$

$$\varepsilon_{M_2}(\omega', \vec{r}') = \varepsilon_{M_1}(\omega, \vec{r}')$$

Then, $$\nabla' \cdot \left[\varepsilon_{M_2}(\omega', \vec{r}')\vec{E}(\vec{r}')\right] = 0 \quad (13)$$

$$\nabla' \cdot \left[\mu_0 \vec{H}(\vec{r}')\right] = 0$$

$$\nabla' \times \vec{E}(\vec{r}') = -j\omega'\mu_0 \vec{H}(\vec{r}')$$

$$\nabla' \times \vec{H}(\vec{r}') = j\omega'\varepsilon_{M_2}(\omega', \vec{r}')\vec{E}(\vec{r}')$$

Comparing equations (10) and (13), it is discovered that equation (10) is a governing equation of electromagnetic field when the wavelength is λ, and if the wavelength is changed to a λ and choosing another specific material whose dielectric constant is the same with that of the original material when the wavelength is λ, equation (13) provides that the solution of the electromagnetic field is maintained, merely the dimension is enlarged a times.

Figure 7:
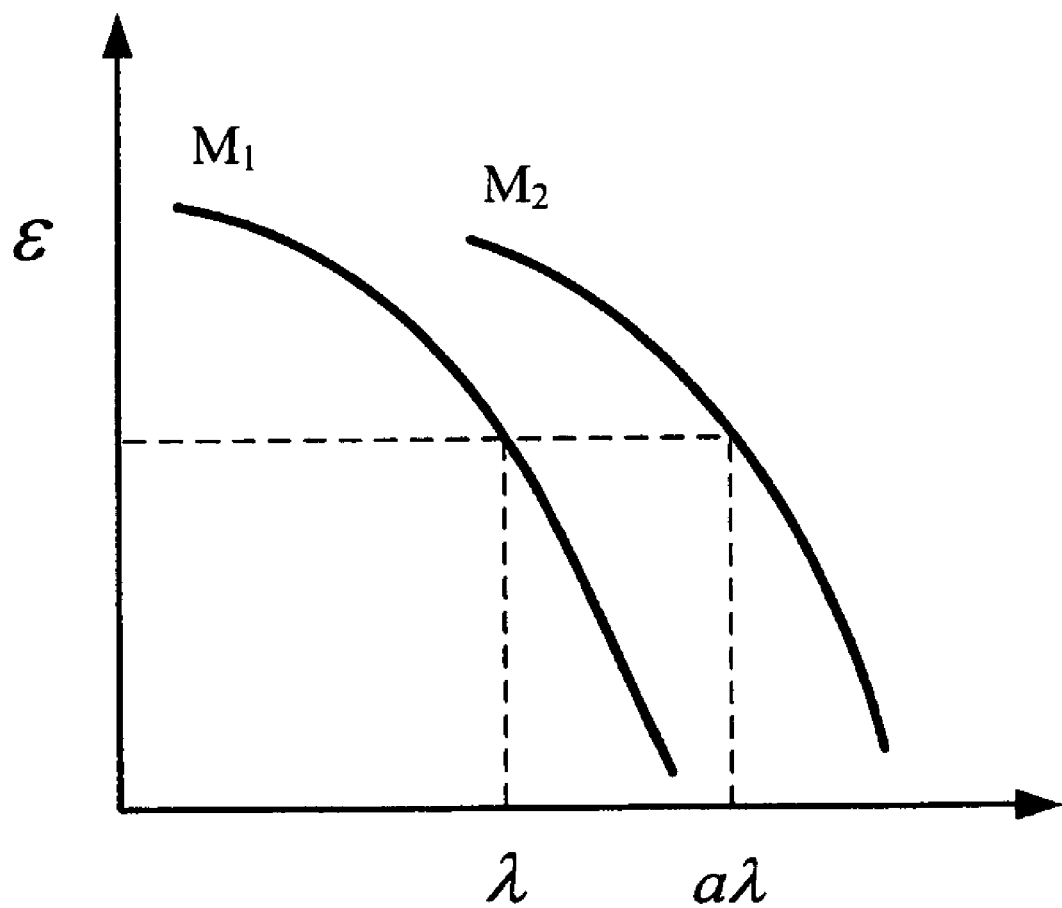
FIG. 7 is a diagram of relative dielectric constant of material vs. wavelength.

Hence, if it is desired to design another optical head suitable for another wavelength, for example using an incident light with a wavelength a times the original wavelength, the design way is as follows: making the dimension of the optical head become a times that of the original design, and using another material, whose dielectric constant at this wavelength is the same with that of the original thin film, to form the thin film. As shown in FIG. 7, if using the material having dispersion relationship as curve $M_1$ to form the thin film at the original wavelength λ, then using the material having dispersion relationship as curve $M_2$ to form the thin film when designing an optical head with a wavelength a λ, and the dielectric constant of the $M_1$ material at the wavelength λ is equal to that of the $M_2$ material at the wavelength a λ. As a consequence, the optical head would have similar physical behavior with the original optical head except that the dimension of the optical head is enlarged a times. Therefore, the present invention provides a method for producing various optical heads with different wavelengths.

The range, effect and relationship of various parameters of the optical head are described as follows:

1. The thin film to build the optical head can be formed by a material with a relative dielectric constant ranging between −4.5 and −6.5 and between −15 and −32.

2. The surface subwavelength structure of the optical head can be formed by a material with a relative dielectric constant ranging between −4.5 and −6.5, between −15 and −32, between 2.5 and 3.3, between 4.8 and 6.5, and between 8.8 and 9.2.

3. The period of the surface subwavelength structure of the optical head can be ranging between 0.35λ and 0.8λ of the incident light.

4. The period of the surface subwavelength structure of the optical head can be ranging between 0.45λ and 0.7λ of the incident light so as to provide a good subwavelength light beam.

5. The thickness of the thin film influences the intensity of the transmitted optical field; as the foregoing, the thin film is used for preventing the incident light from directly transmitting. Therefore, the selection of the thickness of the thin film relies upon the achievement of the above purpose. The more the thickness of the thin film is, the smaller the intensity of the transmitted optical field is. The distribution of the transmitted optical field is hardly influenced by the thickness of the thin film, which corresponds the foregoing transmittance phenomenon of the incident light in the form of surface waves.

6. As the aperture of the passage of the thin film is shrunk, the full width at half maximum of the light beam becomes smaller when the light beam is focused.

7. As the depth of the structure of the surface subwavelength structure becomes shallower, the range of the structure period, capable of modulating the transmitting optical field to show the phenomenon of focusing, is shifted toward a positive direction.

Figure 8:
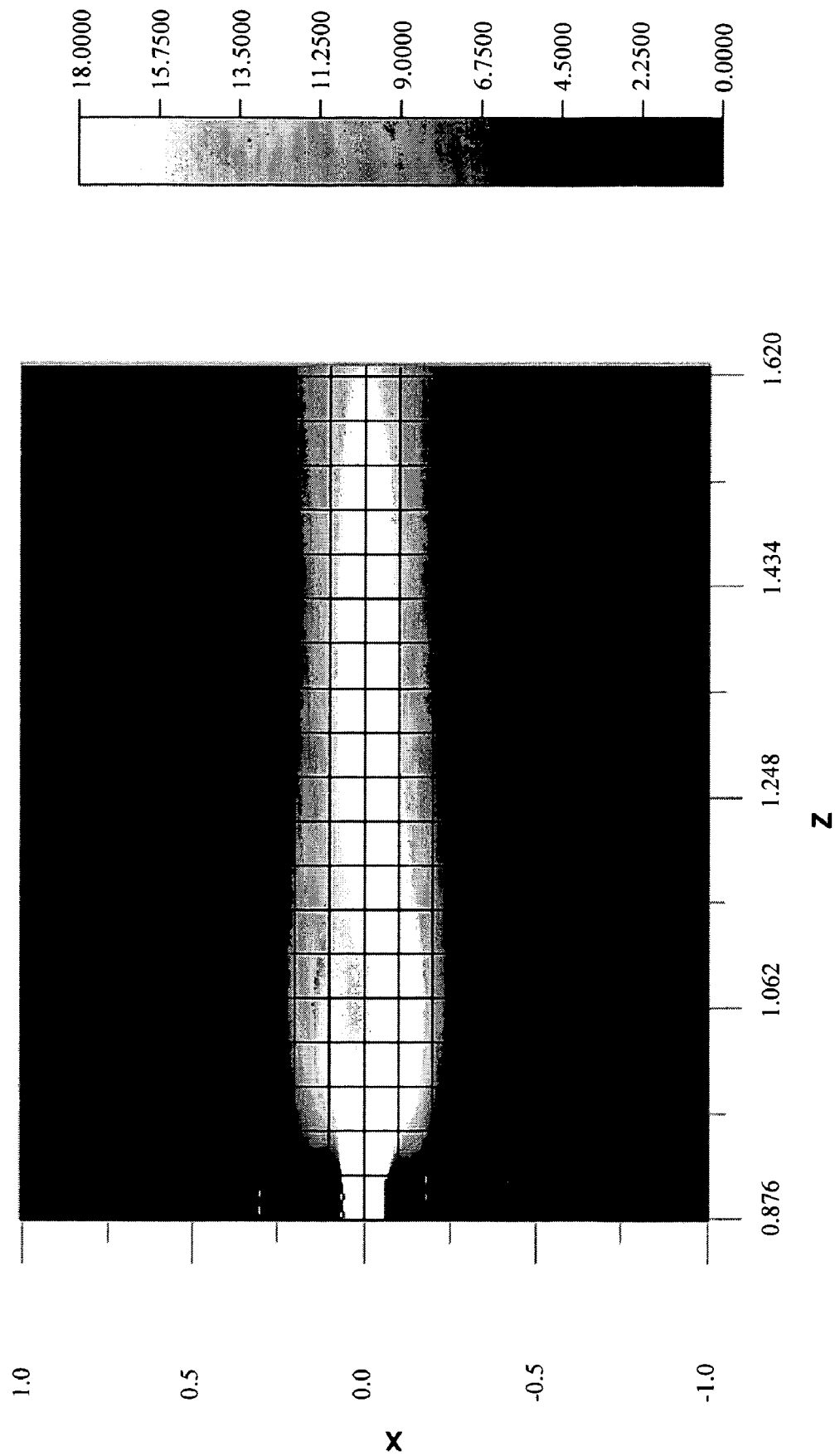
FIG. 8 is a diagram of a distribution of poynting vector in the axis direction according to the first embodiment of the present invention.
Figure 9:
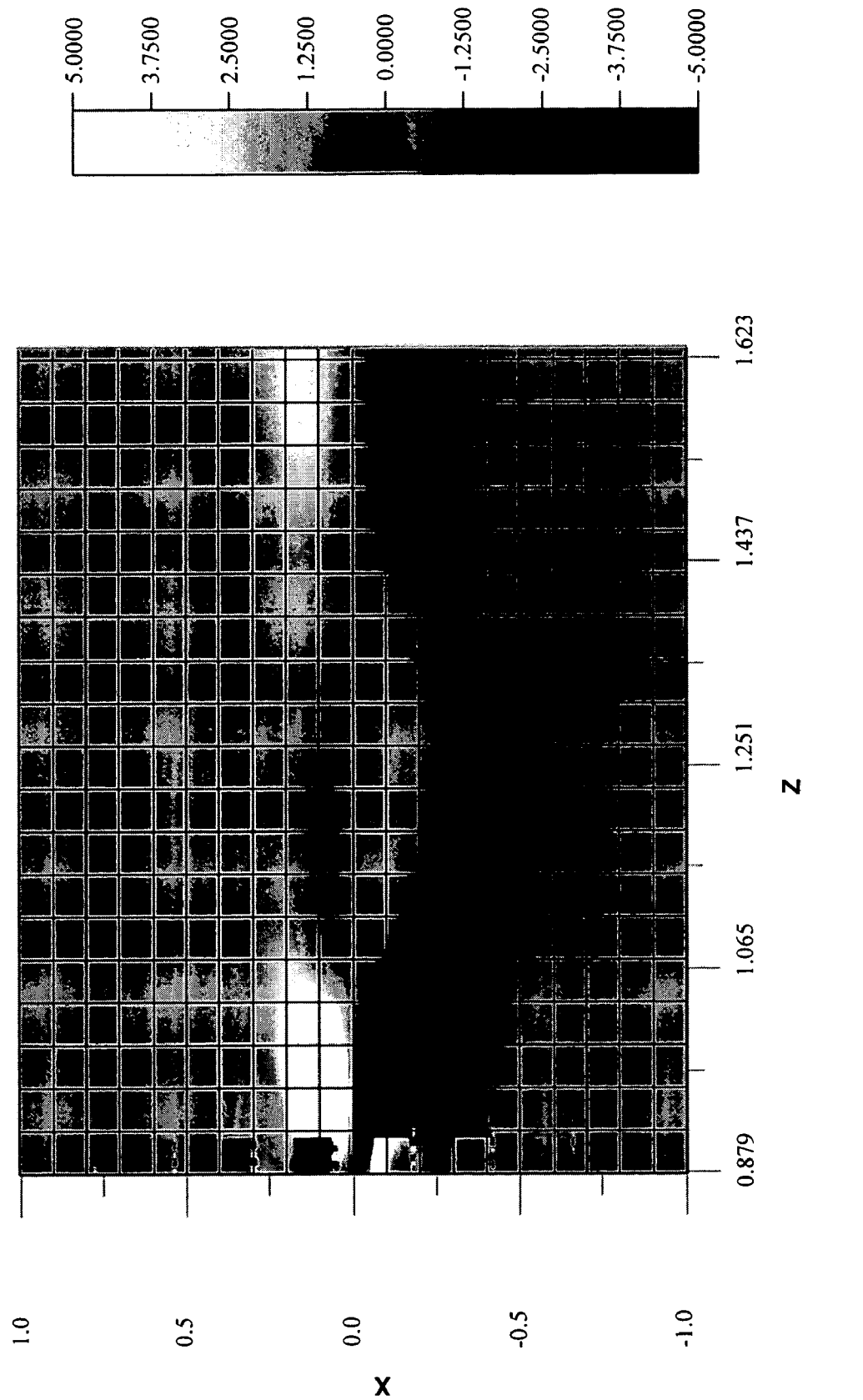
FIG. 9 is a diagram of a distribution of poynting vector in the traverse direction according to the first embodiment of the present invention.

Giving an example by the optical head, for which the wavelength of the incident light is 442 nanometer, the width of the grating is 250 nanometer, the width of the slit is 125 nanometer, the thickness of the thin film is 150 nanometer, the depth of the surface structure is 60 nanometer, and the dielectric constants of the thin film and structure material are −5.76+0.22i (Ag), the result calculated by the Finite Difference Time Domain Method shows that the Poynting vectors of the optical head in axis and traverse directions are respectively as shown in FIG. 8 and FIG. 9, in which the exit of the optical head is positioned at z=0.91 μm. In view of FIG. 8, it is known that the optical field is indeed divergent at the exit of the optical head, but at z=1.00 μm, the traverse energy flow is abruptly decreased to less than one order of the axis energy flow. It means that the divergence angle of the optical field is quite small, ended at z=1.60 μm. The axis distance is about 600 nanometers, however, the poynting vector is mainly concentrated in the 300-nanometer traverse distance. Accordingly, the concept of using the surface subwavelength structure to modulate the optical field to provide a subwavelength-scale optical spot can be proved herein.

Figure 10:
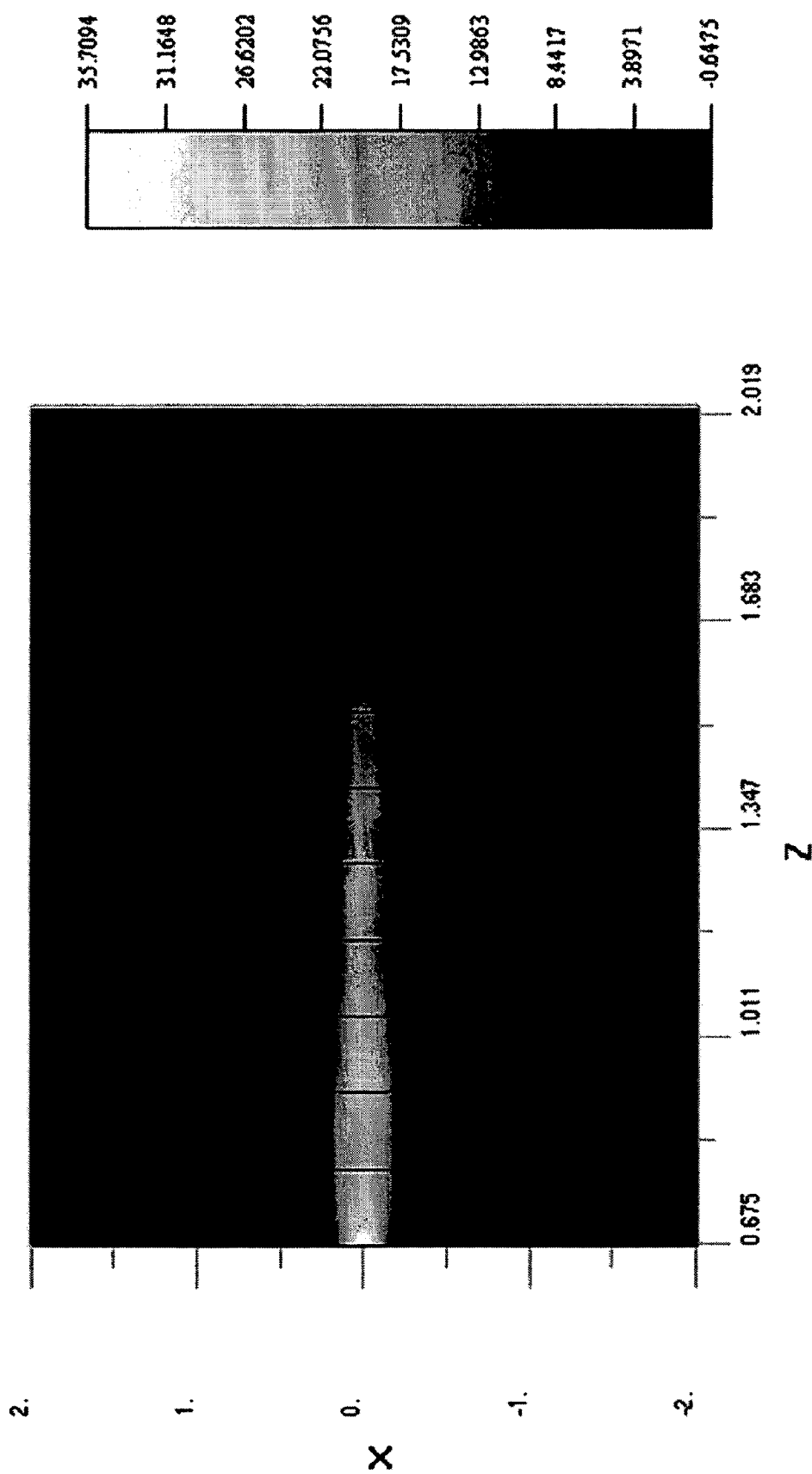
FIG. 10 is a diagram of a distribution of poynting vector in the axis direction according to the second embodiment of the present invention.
Figure 11:
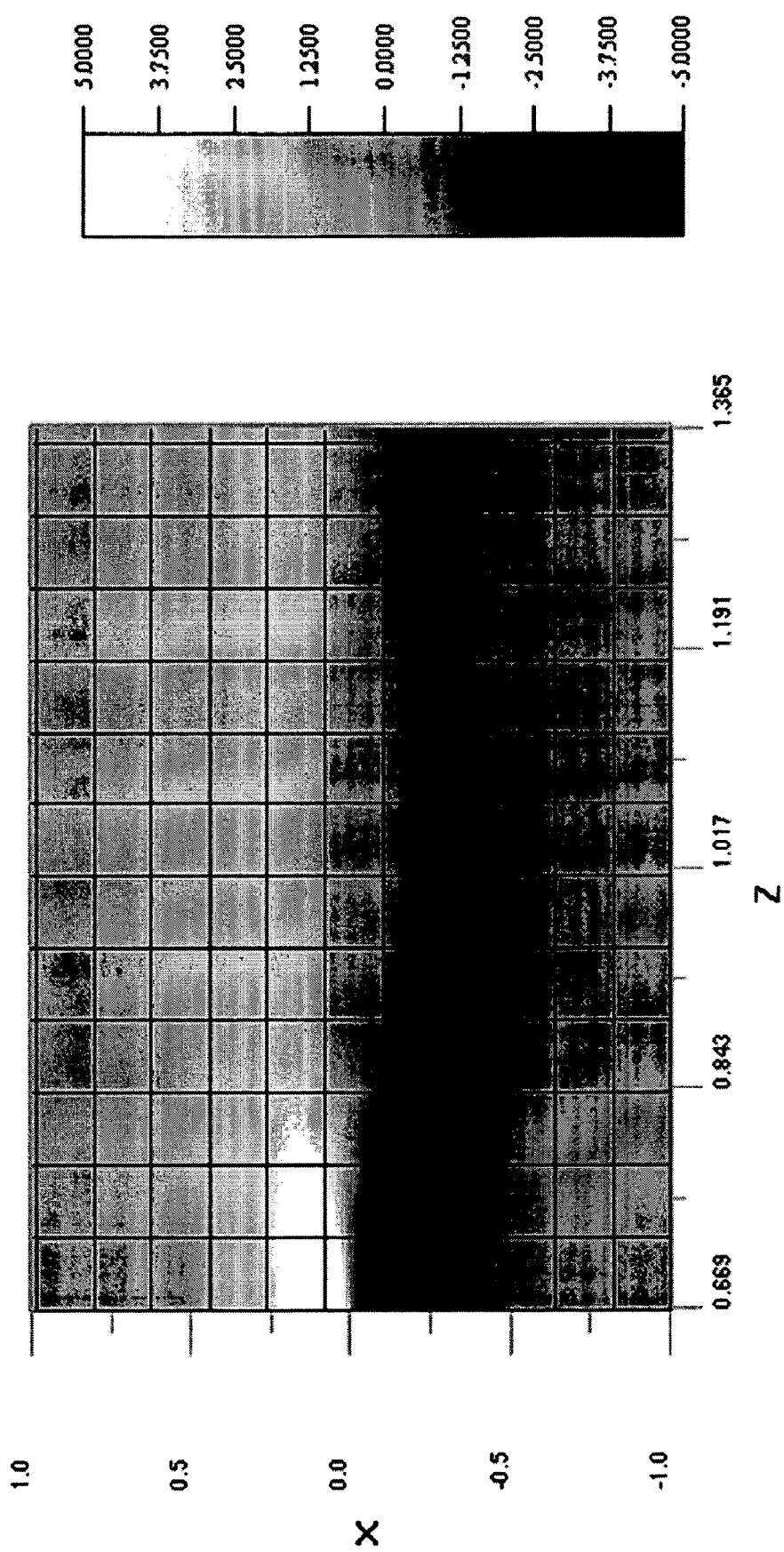
FIG. 11 is a diagram of a distribution of poynting vector in the traverse direction according to the second embodiment of the present invention.

In addition, as shown in FIG. 10 and FIG. 11, a good subwavelength optical field also can be provided in the case that the width of the grating is 260 nanometer, the width of the slit is 130 nanometer, the thickness of the thin film is 150 nanometer, the depth of the surface structure is 60 nanometer, the dielectric constant of the material of the thin film is −5.76−022i (Ag) and the relative dielectric constant of the structure material is 9.

Figure 12:
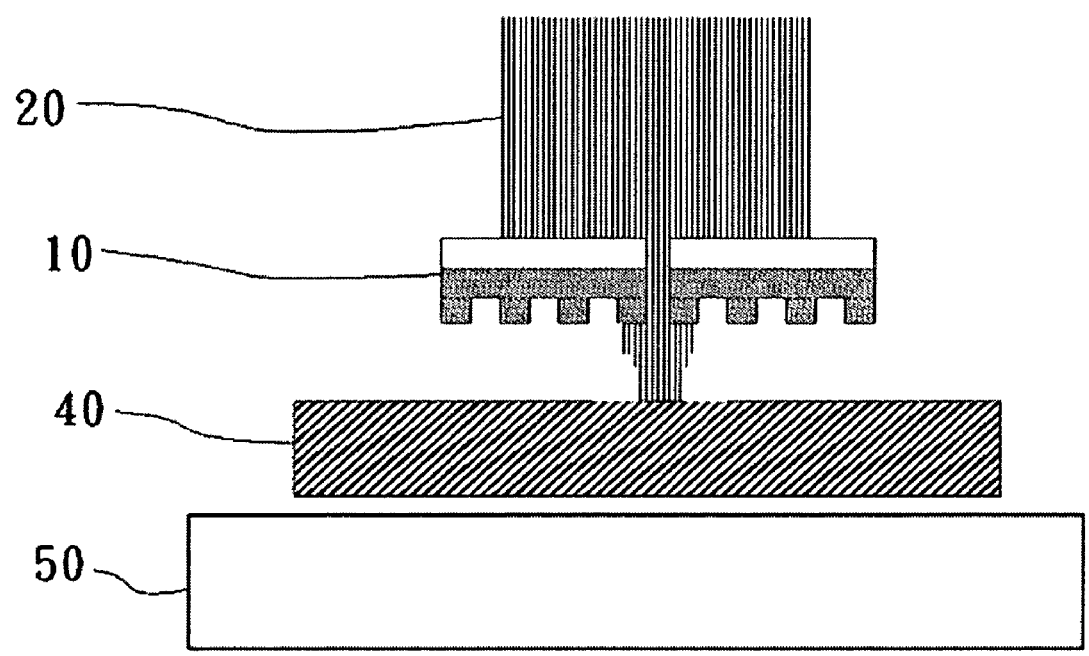
FIG. 12 is the third embodiment of the present invention in which the present optical head is applied to an optical etching device.

The optical head of the present invention also can be applied to optical etching for providing a smaller optical spot for etching to improve the resolution of the optical etching. As shown in FIG. 12, the incident light 20 passes through the optical head 10 to provide an optical spot smaller than the diffraction limit, then radiating onto a photoresist layer 30 for exposing. A translational stage 40 is used for adjusting the relative position between the optical head 10 and the photoresist layer 30 so as to etch various patterns.

Figure 13:
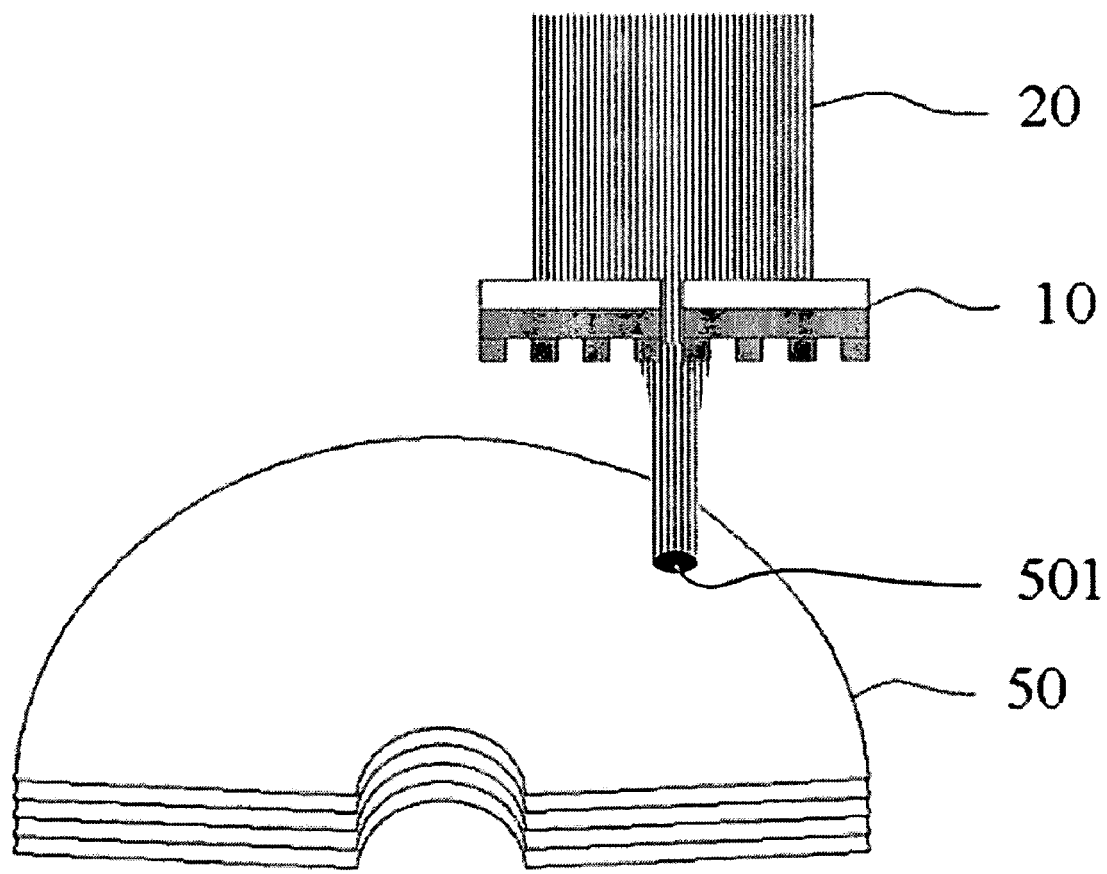
FIG. 13 is the fourth embodiment of the present invention in which the present optical head is applied to an optical storage device.

In addition, the optical head of the present invention can be applied to optical storage for providing a smaller optical spot for recording to improve storage density of the optical storage device. As shown in FIG. 13, the incident light 20 passes through the optical head 10 to provide an optical spot smaller than the diffraction limit, and then radiating onto a photosensitive compound 50. The optical spot for recording is designated as numeral 501.

Figure 14:
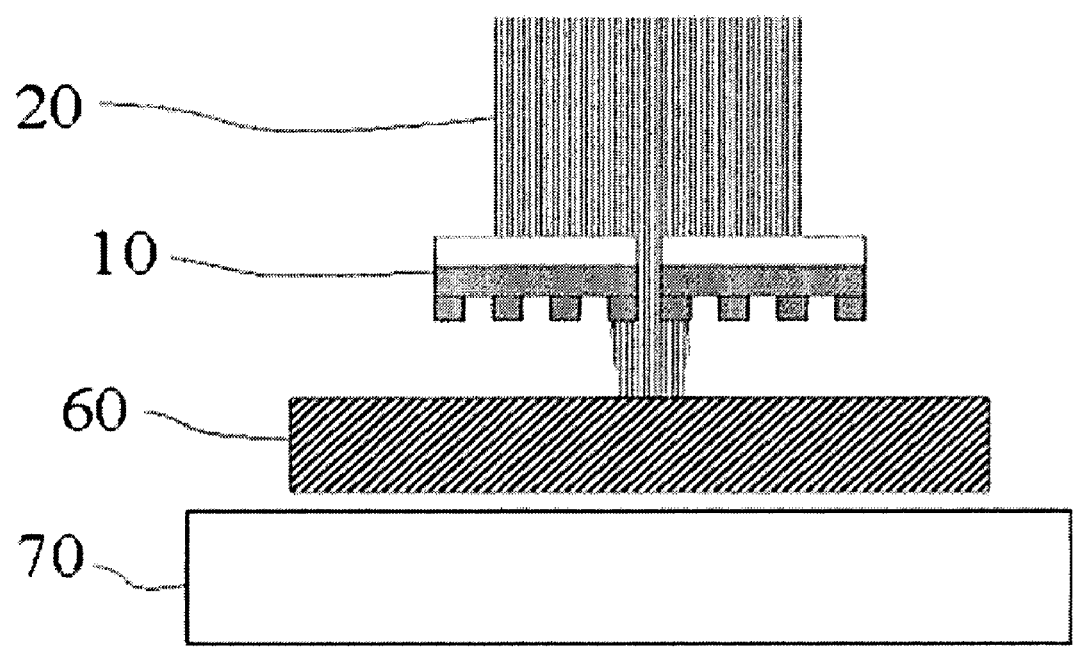
FIG. 14 is the fifth embodiment of the present invention in which the present optical head is applied to optical imaging.

In the application of optical imaging and probing, the optical head of the present invention also can provide a smaller optical spot for measuring to improve the resolution of measurement. As shown in FIG. 14, the incident light 20 passes through the optical head 10 to provide an optical spot smaller than the diffraction limit, and then radiating onto a sample 60 to be monitored, then the intensity of the light transmitted the sample 60 is detected by a light-detecting device 70 to obtain information of the sample 60.

Figure 15:
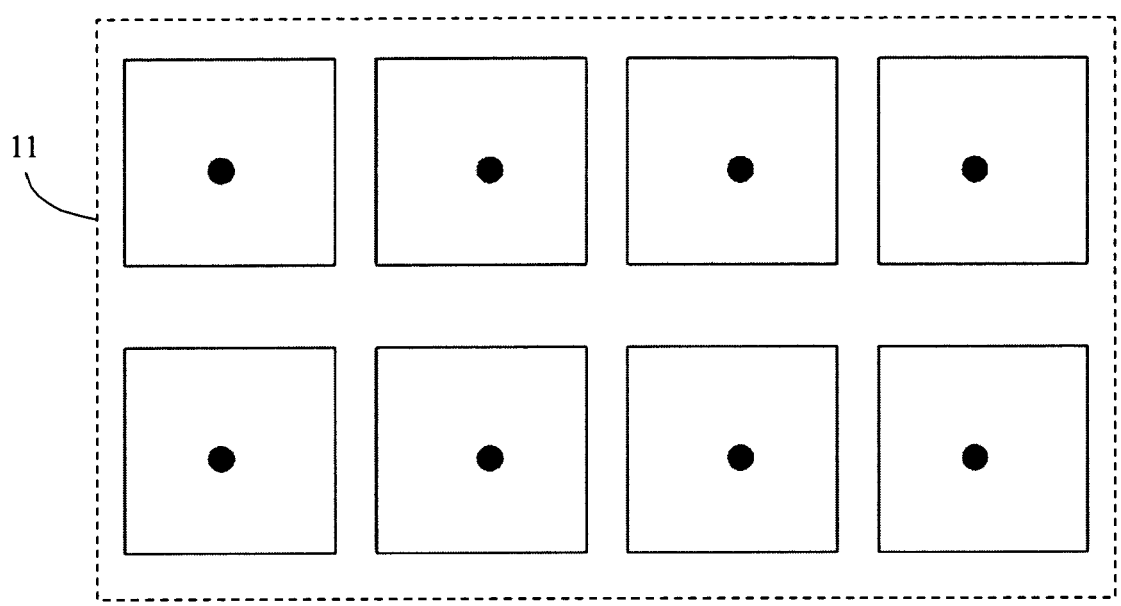
FIG. 15 is a schematic top view of a structure of multi-optical heads according to the sixth embodiment of the present invention.
Figure 16:
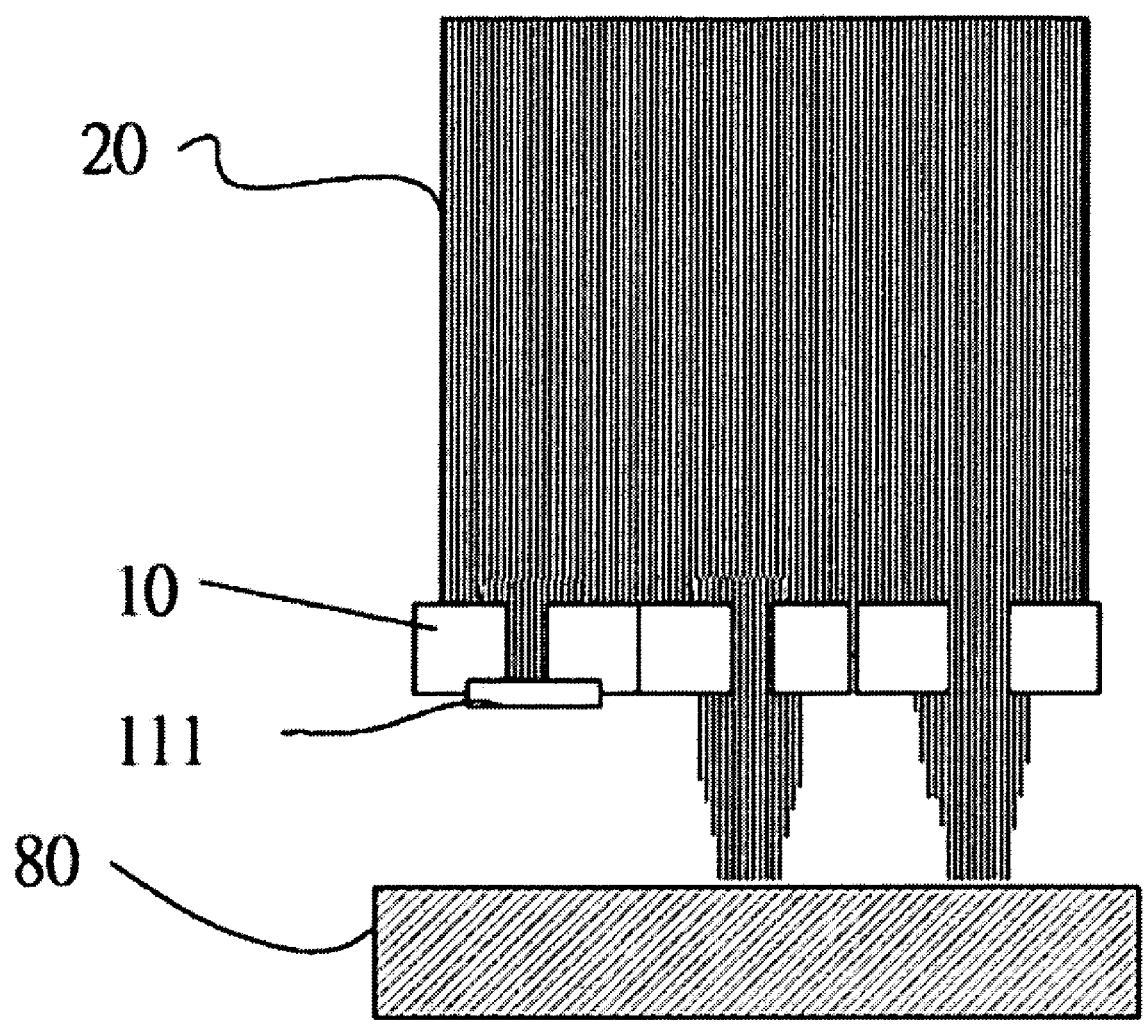
FIG. 16 is a schematic cross sectional view of the structure of the multi-optical heads of the sixth embodiment.

Besides, the present invention can combine a plurality of the optical heads to form a structure of multi-optical heads in order that the optical heads can be either independently operated or operated together. As shown in FIG. 15 and FIG. 16, in which FIG. 15 is a schematic top view of the structure of the multi-optical heads and FIG. 16 is a schematic cross sectional view thereof. The structure of the multi-optical heads 11 includes a plurality of optical heads 10 each of which corresponding to a switch 110 capable of being independently controlled for blocking or permitting the light beams passing through. This technology can be applied to the optical etching, optical storage or optical imaging and probing. Numeral 80 can be a photoresist layer, photosensitive compound or a transparent sample to be monitored.

The embodiments are only used to illustrate the present invention, not intended to limit the scope thereof. Many modifications of the embodiments can be made without departing from the spirit of the present invention.

What is claimed is:

1. An optical etching device, comprising:
   an incident light for providing exposing energy;
   an optical head for converting said incident light to a subwavelength-scale light beam, said optical head including:
   a transparent substrate;
   a thin film having a first surface attached to said transparent substrate, a second surface opposite to said first surface, an inner surrounding wall extending from said first surface to said second surface and a passage with a subwavelength aperture confined by said inner surrounding wall, said passage enabling said incident light propagating from said transparent substrate toward said thin film to generate surface waves on said inner surrounding wall; and
   a surface subwavelength structure formed on said second surface of said thin film for modulating the generated surface waves; and
   a photoresist layer for absorbing energy of the subwavelength-scale light beam of said optical head to perform a lithographic process.

2. The optical etching device of claim 1, wherein further comprising a translational stage to change the relative position between said optical head and said photoresist layer so as to etch patterns.

3. The optical etching device of claim 1, wherein said incident light is generated by a laser source.

4. The optical etching device of claim 1, wherein the structure depth of said surface subwavelength structure of said optical head is larger than 0.025 times the wavelength of said incident light.

5. The optical etching device of claim 1, wherein said surface subwavelength structure is a periodic structure.

6. The optical etching device of claim 1, wherein said surface subwavelength structure of said optical head is a periodic structure with a period ranging between 0.35 times and 0.8 times the wavelength of said incident light.

7. The optical etching device of claim 1, wherein said surface subwavelength structure of said optical head is a periodic structure with a period ranging from 0.45 times to 0.7 times the wavelength of said incident light to provide a good subwavelength light beam.

8. The optical etching device of claim 1, wherein said surface subwavelength structure of said optical head is a grating structure.

9. The optical etching device of claim 1, wherein said thin film of said optical head is formed of a material with a relative dielectric constant ranging from −4.5 to −6.5.

10. The optical etching device of claim 1, wherein said thin film of said optical head is formed of a material with a relative dielectric constant ranging from −15 to −32.

11. The optical etching device of claim 1, wherein said surface subwavelength structure is formed of a material with a relative dielectric constant ranging from −4.5 to 6.5.

12. The optical etching device of claim 1, wherein said surface subwavelength structure is formed of a material with a relative dielectric constant ranging from −15 to −32.

13. The optical etching device of claim 1, wherein said surface subwavelength structure is formed of a material with a relative dielectric constant ranging from −2.5 to −3.3.

14. The optical etching device of claim 1, wherein said surface subwavelength structure is formed of a material with a relative dielectric constant ranging from −4.8 to −6.5.

15. The optical etching device of claim 1, wherein said surface subwavelength structure is formed of a material with a relative dielectric constant ranging from 8.8 to 9.2.

* * * * *